(12) United States Patent
Kim

(10) Patent No.: US 12,497,540 B2
(45) Date of Patent: Dec. 16, 2025

(54) POLISHING COMPOSITION AND POLISHING METHOD USING THE SAME

(71) Applicant: FUJIMI INCORPORATED, Aichi (JP)

(72) Inventor: Hooi-Sung Kim, Tualatin, OR (US)

(73) Assignee: FUJIMI INCORPORATED, Aichi (JP)

(*) Notice: Subject to any disclaimer, the term of this patent is extended or adjusted under 35 U.S.C. 154(b) by 508 days.

(21) Appl. No.: 17/953,476

(22) Filed: Sep. 27, 2022

(65) Prior Publication Data

US 2024/0124744 A1 Apr. 18, 2024

Related U.S. Application Data

(60) Provisional application No. 63/250,837, filed on Sep. 30, 2021.

(51) Int. Cl.

| | |
|---|---|
| *C09G 1/02* | (2006.01) |
| *B24B 37/04* | (2012.01) |
| *C09K 3/14* | (2006.01) |
| *C09K 15/20* | (2006.01) |
| *H01L 21/321* | (2006.01) |

(52) U.S. Cl.
CPC ............ *C09G 1/02* (2013.01); *B24B 37/044* (2013.01); *C09K 3/1436* (2013.01); *C09K 15/20* (2013.01); *H01L 21/3212* (2013.01)

(58) Field of Classification Search
CPC ...... C09G 1/02; B24B 37/044; C09K 3/1436; C09K 15/20; H01L 21/3212
See application file for complete search history.

(56) References Cited

U.S. PATENT DOCUMENTS

| | | | |
|---|---|---|---|
| 7,994,057 B2 | 8/2011 | Dysard et al. | |
| 9,028,572 B2 | 5/2015 | Grumbine et al. | |
| 9,422,456 B2 | 8/2016 | Grumbine et al. | |
| 2002/0088979 A1* | 7/2002 | Kawai | H10D 62/824 257/E29.091 |
| 2017/0081552 A1* | 3/2017 | Yamato | H01L 21/32115 |
| 2019/0051537 A1* | 2/2019 | Peng | H01L 21/02175 |
| 2019/0085205 A1* | 3/2019 | Chien | C09K 3/1436 |
| 2020/0208014 A1 | 7/2020 | Zhang et al. | |

FOREIGN PATENT DOCUMENTS

CN 108977173 * 12/2018 ............ C09G 1/02

OTHER PUBLICATIONS

First Office Action for TW Application No. 111135709, with a mailing date of Aug. 8, 2025.

* cited by examiner

*Primary Examiner* — Pegah Parvini
(74) *Attorney, Agent, or Firm* — Katten Muchin Rosenman LLP

(57) ABSTRACT

The present disclosure relates to a polishing composition enabling an improved molybdenum removal rate while reducing etching of molybdenum (high Mo RR/Mo SER ratio) and simultaneously enabling a high ratio of molybdenum removal rate to silicon oxide removal rate (Mo:TEOS removal rate selectivity), wherein, the polishing composition comprises an abrasive, a molybdenum (Mo) removal rate enhancer, an organic acid, an oxidizer, a corrosion inhibitor, and water, combined in specified amounts to provide a composition with advantageous properties such as high Mo RR/Mo SER ratio and high Mo:TEOS removal rate selectivity, thus providing a composition well suited for polishing a molybdenum surface.

18 Claims, No Drawings

POLISHING COMPOSITION AND POLISHING METHOD USING THE SAME

CROSS-REFERENCE

The present application is based on U.S. Provisional Application No. 63/250,837 filed on Sep. 30, 2021, the disclosures of which are incorporated herein by reference in their entirety.

TECHNOLOGICAL FIELD

The present disclosure relates to a polishing composition and a polishing method using the same.

BACKGROUND

CMP is a process in which material is removed from a surface of a substrate (such as a semiconductor wafer) and the surface is polished (planarized) by coupling a physical process, such as abrasion, with a chemical process, such as oxidation or chelation. In its most rudimentary form, CMP involves applying a slurry to the surface of the substrate or a polishing pad that polishes the substrate. This process achieves both the removal of unwanted material and planarization of the surface of the substrate. It is not desirable for the removal or polishing process to be purely physical or purely chemical, but rather comprise a synergistic combination of both.

CMP is used on a large variety of objects, examples of which include silicon dioxide ($SiO_2$) in inter-layer or buried dielectrics; metals such as aluminum (Al), copper (Cu), and tungsten (W) in wiring layers or plugs connecting to such a wiring layer; a barrier metal layer such as tantalum (Ta), tantalum nitride (TaN), and titanium (Ti); polysilicon for use as a trench capacitor; and molybdenum (Mo), which is used in a wide range of applications.

Molybdenum may be used in a variety of industrial applications, including microelectronic devices such as connectors, photo masks, and semiconductor device manufacture. In such applications, molybdenum is often initially utilized in an excess amount. This requires that some molybdenum must be removed in order to provide a substrate with suitable surface properties.

For such substrates containing molybdenum, there are increasing new requirements of selectively polishing molybdenum rather than other materials (e.g., silicon oxide made from tetraethyl orthosilicate (TEOS)) under polishing at a high polishing speed.

Accordingly, the polishing of semiconductors requires selective removal of molybdenum in comparison to other materials, such as silicon oxide. However, current polishing compositions for use with molybdenum have insufficient removal rates. These limitations prolong the polishing process and lower the throughput of the process when using CMP. In addition, it is disadvantageous that layers made of other materials (e.g., a layer of silicon oxide present beneath a molybdenum layer), rather than a molybdenum layer, are polished. Accordingly, it is needed that the ratio of molybdenum removal rate to silicon oxide removal rate is high (i.e., the removal rate selectivity for molybdenum against silicon oxide is high). Thus, polishing compositions currently used in CMP have problems, e.g., with respect to improvement in molybdenum removal rates and improvement in removal rate selectiveness for molybdenum against silicon oxide.

In light of the challenges surrounding selective polishing of molybdenum-containing substrates, it is critical to identify polishing compositions enabling an improved molybdenum removal rate while reducing etching of molybdenum and simultaneously enabling a high ratio of molybdenum removal rate to silicon oxide removal rate (i.e., the removal rate selectivity for molybdenum against silicon oxide is high). These and other challenges are addressed by the subject matter disclosed herein.

CITATION LIST

Patent Literature

[Patent Literature 1] U.S. Pat. No. 7,994,057
[Patent Literature 2] U.S. Pat. No. 9,028,572
[Patent Literature 3] U.S. Pat. No. 9,422,456

In accordance with the purpose(s) of the currently disclosed subject matter or problems to be solved by the invention, as embodied and broadly described herein, it is an object of the present invention to provide a composition for polishing substrates, such as those containing molybdenum, that facilitate improvement in polishing speeds when using CMP. Another object of the present invention is to provide a method for selective removal of a material from a substrate, such as molybdenum.

SUMMARY

Accordingly, the presently disclosed subject matter in one aspect relates to a polishing composition comprising an abrasive, a molybdenum removal rate enhancer, an organic acid, an oxidizer, a corrosion inhibitor, and water. In some embodiments, the abrasive is cation-modified silica; the molybdenum removal rate enhancer is an iron salt; the oxidizer is a peroxide; and the corrosion inhibitor is a positively charged amino acid; and the polishing composition has a pH from about 2 to about 5.

In a further embodiment, the polishing composition has a molybdenum removal rate of at least about 200 Å/min and a TEOS removal rate of less than about 50 Å/min. In a further embodiment, the polishing composition has a Mo:TEOS removal rate selectivity of at least about 4.5.

In another aspect, the subject matter described herein is directed to a method for polishing a substrate, the method comprising the steps of: 1) providing the polishing composition of claim 1; 2) providing a substrate, wherein the substrate comprises a molybdenum-containing layer; and 3) polishing the substrate with the polishing composition to provide a polished substrate.

DETAILED DESCRIPTION OF EMBODIMENTS

The present invention can be understood more readily by reference to the following detailed description of the invention and the examples included therein.

Before the present compounds, compositions, articles, systems, devices, and/or methods are disclosed and described, it is to be understood that they are not limited to specific synthetic methods unless otherwise specified, or to particular components unless otherwise specified, as such may, of course, vary. It is also to be understood that the terminology used herein is for describing particular aspects only, and is not intended to be limiting. Although, any methods and materials that are similar or equivalent to those described herein can be used in the practice or testing of the present invention, example methods and materials are now described.

Described herein are polishing compositions comprising an abrasive, a molybdenum removal rate enhancer, an organic acid, an oxidizer, a corrosion inhibitor, and water. These polishing compositions are intended for polishing a substrate. It is an object of the present invention to provide a polishing composition achieving both (a1) a high molybdenum removal rate while reducing etching of molybdenum; and (a2) a high ratio of molybdenum removal rate to silicon oxide removal rate (hereinafter, "high removal rate selectivity for molybdenum against silicon oxide").

Hereinafter, "high molybdenum removal rate while reducing etching of molybdenum" is occasionally expressed as "high Mo RR/Mo SER ratio." Mo RR means molybdenum removal rate, and Mo SER means molybdenum static etch rate. Further, the situation that the ratio of molybdenum removal rate to silicon oxide removal rate is high refers to the situation that the removal rate selectivity for molybdenum against silicon oxide is high, and hereinafter occasionally expressed as "high removal rate selectivity for molybdenum" or "high Mo:TEOS removal rate selectivity", simply.

It is preferable that the two effects: (a1) a high Mo RR/Mo SER ratio; and (a2) high Mo:TEOS removal rate selectivity be both good. According to an embodiment, the effect of (a1) a high Mo RR/Mo SER ratio is much better than the effect of (a2) high Mo:TEOS removal rate selectivity. According to another embodiment, the effect of (a2) high Mo:TEOS removal rate selectivity is much better than the effect of (a1) a high Mo RR/Mo SER ratio.

Another object of the present invention is to provide a polishing composition that exhibits at least one benefit such as: 1) a low molybdenum static etch rate; 2) a high molybdenum removal rate; 3) a low TEOS removal rate; 4) high composition stability; and 5) high Mo:TEOS removal rate selectivity.

Here, the "static etch rate" is calculated as the rate of the etching of a coupon when the coupon is soaked in an etching solution. For a high static etch rate, the surface of an object is chemically eroded, and the thickness gradually decreases. Generally, surface flatness is not ensured in that case. Moreover, it is difficult to control the post-polishing thickness through polishing. Accordingly, lower etch rates are preferred for the polishing composition.

The effects of the polishing composition of the present invention are a high molybdenum removal rate and high removal rate selectivity for molybdenum against TEOS. Evaluation results of a low molybdenum static etch rate and a high ratio of molybdenum remove rate to molybdenum static etch rate can confirm those effects.

The polishing composition of the present invention has a molybdenum static etch rate preferably of 100 Å/min or less, more preferably of 50 Å/min or less, even more preferably of 20 Å/min or less, particularly preferably of less than 20 Å/min. The lower limit of the molybdenum static etch rate is not particularly limited, but is practically 0.1 Å/min or more.

The polishing composition of the present invention has a molybdenum removal rate preferably of 150 Å/min or more, more preferably of 200 Å/min or more, even more preferably of 210 Å/min or more. The upper limit of the molybdenum removal rate is not particularly limited, but is practically 500 Å/min or less.

The polishing composition of the present invention has a TEOS removal rate preferably of 55 Å/min or less, more preferably of 50 Å/min or less, even more preferably of 48 Å/min or less. In an embodiment, the polishing composition has a TEOS removal rate of less than 50 Å/min. In an embodiment, the polishing composition has a TEOS removal rate of less than 40 Å/min. The lower limit of the TEOS removal rate is not particularly limited, but is practically 5 Å/min or more.

The polishing composition of the present invention has a Mo RR/Mo SER ratio preferably of 20 or more, more preferably of 23 or more, even more preferably of 25 or more. The upper limit of the Mo RR/Mo SER ratio is not particularly limited, but is practically 50 or less.

The polishing composition of the present invention has a Mo:TEOS removal rate selectivity preferably of 4 or more, more preferably of 4.5 or more, even more preferably of 6 or more. The upper limit of the Mo:TEOS removal rate selectivity is not particularly limited, but is practically 30 or less.

The molybdenum static etch rate, molybdenum removal rate, TEOS removal rate, composition stability, and Mo:TEOS removal rate selectivity of the polishing compositions described herein are key properties. Compositions exhibiting these key properties may be obtained by use of specific components in requisite amounts. For example, in an embodiment, a polishing composition comprising an abrasive, a molybdenum removal rate enhancer, an organic acid, an oxidizer, a corrosion inhibitor, and water has been found to provide a high Mo:TEOS removal rate selectivity, wherein the concentrations of each component of the polishing composition must be present in specific amounts to provide a high rate of Mo removal and a low rate of TEOS removal. For example, if the polishing composition comprises too much corrosion inhibitor, detrimental effects may be observed (such as an unacceptably low Mo removal rate). These and other effects of the components and concentrations of components are discussed further herein.

The polishing compositions described herein have uses such as, but not limited to, the CMP of molybdenum-containing substrates.

A. Definitions

Listed below are definitions of various terms used to describe this invention. These definitions apply to the terms as they are used throughout this specification, unless otherwise limited in specific instances, either individually or as part of a larger group.

As used in the specification and the appended claims, the singular forms "a," "an" and "the" include plural referents unless the context clearly dictates otherwise. Thus, for example, reference to "an abrasive" or "a pH-adjusting agent" includes mixtures of two or more such abrasives or pH-adjusting agents.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. It will also be understood that there are a number of values disclosed herein, and that each value is herein disclosed as "about" that particular value in addition to the value itself. For example, if the value "10" is disclosed, then "about 10" is also disclosed. It will also be understood that each unit between two particular units is also disclosed. For example, if 10 and 15 are disclosed, then 11, 12, 13, and 14 are also disclosed.

References in the specification and concluding claims to parts by weight of a particular element or component in a composition denote the weight relationship between the element or component and any other elements or components in the composition or article for which a part by weight is expressed. Thus, in a compound containing 2 parts by weight of component "X" and 5 parts by weight of component "Y," "X and Y" are present at a weight ratio of 2:5, and are present in such ratio regardless of whether additional components are contained in the compositions.

A weight percent (wt %) of a component, unless specifically stated to the contrary, is based on the total weight of the vehicle or composition in which the component is included.

As used herein, the terms "optional" and "optionally" mean that the subsequently described event or circumstance can or cannot occur, and that the description includes instances where said event or circumstance occurs and instances where it does not.

B. Polishing Composition

The fundamental mechanism of CMP is to soften a surface layer by chemical reaction and then remove the softened layer by mechanical force with abrasive particles. However, the role of CMP is not only material removal, but also planarization, surface smoothening, uniformity control, defect reduction and more. Semiconductor yield enhancement is thus influenced by CMP processing. Surface scratching, which can be generated by CMP, is an extremely detrimental defect in semiconductor manufacturing. Hence, to achieve proper CMP performance without surface scratching, development of polishing compositions is crucially important. Requirements for CMP include planarized surfaces with planarity <15 nm, roughness-free surfaces with surface roughness <1 nm, defect-free surfaces with scratch and pit counts of 0 counts per wafer, are contamination free, have a high productivity, and are planarized with a high removal rate of the desired material to be removed.

In polishing compositions for use with molybdenum (Mo) and TEOS-containing substrates, one key performance metric is a high Mo:TEOS removal rate selectivity, which provides minimal TEOS removal. Polishing compositions with high Mo:TEOS selectivity are ideally formulated at pH=2-5. These and other aspects will be discussed further herein.

In light of the complexity surrounding the various mechanisms of Mo and TEOS removal rates, it is critical to identify compositions enabling a high Mo removal rate, while simultaneously enabling a low TEOS removal rate, and thus providing high Mo:TEOS removal rate selectivity.

Thus, key aspects of the polishing compositions described herein include, but are not limited to: 1) high Mo removal rates (RR); 2) low Mo static etch rate (SER); 3) high Mo RR/Mo SER ratio; 4) low TEOS RR; 5) high Mo:TEOS removal rate selectivity; and 6) a key pH. As described herein, the combination of specific components in specified amounts is key to obtaining these desired properties.

1. Abrasive

The polishing composition described herein contains an abrasive. The abrasive is typically a metal oxide abrasive preferably selected from the group consisting of silica, alumina, titania, zirconia, germania, ceria and mixtures thereof. In some embodiments, the abrasive is silica. In a further embodiment, the abrasive is colloidal silica.

In some embodiments, the abrasive is surface modified. For example, the surface-modified abrasive may be cation-modified silica. In an embodiment, the cation-modified silica may be silica which is surface-modified by treatment with an aminosilane, such as to produce a silica with a positive zeta potential. In other embodiments, the surface of the silica particles have been treated with an aminosilane such as bis(trimethoxysilylpropyl)amine, e.g., SILQUEST Al 170 (Crompton OSi Specialties), or a similar reactive aminosilane. By virtue of those treatments, the surface of the cation-modified silica has amino groups covalently attached.

Cation-modified silica particles having a permanent positive charge in the polishing composition may be obtained, for example, via treating the particles with at least one aminosilane compound as disclosed in U.S. Pat. Nos. 7,994,057 and 9,028,572. Alternatively, cation-modified silica particles having a permanent positive charge in the polishing composition may be obtained by incorporating a chemical species, such as an aminosilane compound, in the colloidal silica particles as disclosed in U.S. Pat. No. 9,422,456.

Further, as with the cation-modified silica, a commercially available aqueous dispersion can be used. Examples of such commercially available products include Snowtex AK, Snowtex AK-L (all of which are trade names manufactured by Nissan Chemical Co., Ltd.), Cataloid SN (trade name manufactured by Nikki Catalyst Kasei Co., Ltd.), and Quartron PL-3-C (trade name manufactured by Fuso Chemical Industry Co., Ltd.).

In an embodiment, the abrasive is colloidal silica. In a further embodiment, the abrasive has a positive zeta potential. In still further embodiments, the abrasive is silica with a positive zeta potential when in the polishing composition. The positive zeta potential may be in the range from about +5 mV to about +60 mV, from about +10 mV to about +55 mV, or from about +20 mV to about +50 mV. The positive zeta potential may be in the range from about +5 mV to about +60 mV, from about +10 mV to about +50 mV, or from about +20 mV to about +40 mV. In some embodiments, the positive zeta potential is about +5 mV, about +10 mV, about +15 mV, about +20 mV, about +25 mV, about +30 mV, about +35 mV, about +40 mV, about +45 mV, about +50 mV, about +55 mV, or about +60 mV.

The abrasive can have any suitable particle size. For example, the abrasive can have an average secondary particle size of about 10 nm or more, about 25 nm or more, about 40 nm or more, about 50 nm or more, or about 60 nm or more. Alternatively, or in addition, the abrasive can have an average secondary particle size of about 1,000 nm or less, about 500 nm or less, about 200 nm or less, about 120 nm or less, about 100 nm or less, about 90 nm or less, or about 80 nm or less. For example, in some embodiments, the abrasive can have an average secondary particle size in a range from about 40 nm to about 120 nm, from about 50 nm to about 100 nm, or from about 60 nm to about 80 nm. In some embodiments, the average secondary particle size is about 10 nm, about 15 nm, about 20 nm, about 25 nm, about 30 nm, about 35 nm, about 40 nm, about 45 nm, about 50 nm, about 65 nm, about 70 nm, about 75 nm, or about 100 nm. A particle size analyzer (Horiba Particle Size Distribution tool) can measure the average particle size of the abrasive.

The abrasive can have any suitable surface area. For example, the abrasive can have an average surface area of about 50 m$^2$/g or more, about 60 m$^2$/g or more, or about 70 m$^2$/g or more. Alternatively, or in addition, the abrasive can have an average surface area of about 120 m$^2$/g or less, about 110 m$^2$/g or less, about 100 m$^2$/g or less, or about 90 m$^2$/g or less. In some embodiments, the abrasive can have an average surface area of about 55 m²/g, about 65 m²/g, about 75 m²/g, about 80 m²/g, about 85 m²/g, or about 90 m²/g.

In some embodiments, the amount of abrasive has an effect on the properties of the polishing composition, such as Mo RR, Mo SER, and TEOS RR. The concentration of the polishing composition is about 0.01 wt % or more, about 0.05 wt % or more, about 0.1 wt % or more, about 0.2 wt % or more, about 0.25 wt % or more, about 0.5 wt % or more, about 0.75 w % or more, about 1 wt % or more, about 3 wt % or more, or about 5 wt % or more, with respect to the entire composition. Alternatively, or in addition, the amount of abrasive in the polishing composition can be about 5 wt % or less, about 3 wt % or less, about 1 wt % or less, about 0.75 wt % or less, about 0.5 wt % or less, about 0.25 wt % or less, about 0.1 wt % or less, about 0.05 wt % or less, about 0.01 wt % or less, or about 0.05 wt % or less. In some embodiments, the amount of abrasive in the polishing composition can be in a range from about 0.01 wt % to about 5 wt %, about 0.05 wt % to about 2.5 wt %, from about 0.1 wt % to about 1.5 wt %, or from about 0.5 wt % to about 1 wt %. In some embodiments, the amount of abrasive is about 0.1 wt %, about 0.25 wt %, about 0.5 wt %, about 0.75 wt %, about 1 wt %, about 1.35 wt %, about 1.5 wt %, about 2 wt %, about 3 wt %, about 4 wt %, or about 5 wt %. In an embodiment, the amount of abrasive is from about 1.0 wt % to about 1.5 wt %. In an embodiment, the amount of abrasive is about 1.35 wt % with respect to the entire composition. In another embodiment, the amount of abrasive is about 0.75 wt % with respect to the entire composition.

While the abrasive can be of any reasonable size, the size of the abrasive influences the smoothness of the finish obtained. Precision polishing operations materials such as optical components, plastics, metals, gemstones, semiconductor components, and the like typically involve the use of abrasives with smaller sizes. For example, compositions for use in connection with precision polishing involve suspensions of abrasives with smaller average particle sizes.

The abrasive is suspended in the compositions disclosed herein and is colloidally stable. The term colloid refers to the suspension of abrasive particles in the liquid carrier. Colloidal stability refers to the maintenance of the suspension over time. In some embodiments, the polishing composition is stable for at least 1, 2, 3, 4, 5, 6, or 7 days at 50° C. In some embodiments, the suspension is stable for at least 1 week, at least 2 weeks, at least 3 weeks, or at least 4 weeks at 50° C.

In the context of this invention, a polishing composition is considered colloidally stable if, when the silica is placed into a 100-mL graduated cylinder and allowed to stand without agitation for a time of two hours, the difference between the concentration of particles in the bottom 50 mL of the graduated cylinder ([B] in terms of g/mL) and the concentration of particles in the top 50 mL of the graduated cylinder ([T] in terms of g/mL) divided by the total concentration of particles in the polishing composition ([C] in terms of g/mL) is less than or equal to 0.5 (i.e., ([B]−[T])/[C] is less than or equal to 0.5). The value of ([B]−[T])/[C] desirably is less than or equal to 0.3, and preferably is less than or equal to 0.1, more preferably less than or equal to 0.05, even more preferably less than or equal to 0.04, and most preferably less than or equal to 0.03.

In an embodiment, the abrasive is cation-modified silica. In some embodiments, the abrasive substantially comprises cation-modified silica. As used herein, "substantially" means that 95% by weight or more, preferably 98% by weight or more, more preferably, 99% by weight or more of the particles constituting the abrasive are cation-modified silica, and it includes that 100% by weight of the particles are cation-modified silica.

2. Molybdenum Removal Rate Enhancers

In one aspect, the polishing composition may comprise one or more molybdenum (Mo) removal rate enhancers. The removal rate enhancers are iron salts, which, when combined with oxidizers such as hydrogen peroxide, enhance the removal of Mo. Without being bound by theory, it is believed this rate enhancement proceeds via the Fenton reaction.

The iron salts used in the polishing compositions may be salts of divalent iron, salts of trivalent iron, salts of high valent iron, zerovalent iron, $Fe_4O_3$, iron (III) oxide, iron (III) oxide-hydroxide, iron (II) oxide. Non-limiting specific examples of iron salts include salts of divalent and trivalent iron, such as iron (II) sulfate ($FeSO_4$), iron (III) sulfate ($Fe_2(SO_4)_3$), and iron (III) nitrate ($Fe(NO_3)_3$). In an embodiment, the molybdenum removal rate enhancer is iron (III) nitrate ($Fe(NO_3)_3$).

In some embodiments, the amount of iron salt has an effect on the properties of the polishing composition, such as Mo RR, Mo SER, and TEOS RR. In some embodiments, the amount of iron salt present in the polishing composition is in a range from about 0.00001 wt % to about 0.001 wt %, from about 0.00005 wt % to about 0.00075 wt %, from about 0.0001 wt % to about 0.0007 wt %, from about 0.0002 wt % to about 0.0006 wt %, or from about 0.0002 wt % to about 0.0004 wt %, based on the total amount of the polishing composition at 100 wt %. In some embodiments, the iron salt is present in the polishing composition at about 0.0001 wt % or more, about 0.00005 wt % or more, about 0.0001 wt % or more, about 0.0003 wt % or more, or about 0.0005 wt % or more. Alternatively, or in addition, the amount of iron salt in the polishing composition can be about 0.001 wt % or less, about 0.0007 wt % or less, about 0.0005 wt % or less, about 0.0003 wt % or less, or about 0.00001 wt % or less. In some embodiments, the amount of iron salt is about 0.00001 wt %, about 0.00005 wt %, about 0.0001 wt %, about 0.0002 wt %, about 0.0003 wt %, about 0.0004 wt %, about 0.0005 wt %, about 0.0006 wt %, about 0.0007 wt %, or about 0.001 wt %.

3. Oxidizer

The molybdenum removal rate enhancers are accompanied by an oxidizer, thus facilitating the Fenton reaction. The oxidizer used in the polishing composition of the present invention is a peroxide. Non-limiting examples of the oxidizer include periodic acid, hydrogen peroxide, potassium iodate, potassium permanganate, persulfate salts (e.g., ammonium persulfate and potassium dipersulfate), periodate salts (e.g., potassium periodate), ammonium molybdate, ferric nitrate, nitric acid, potassium nitrate, and mixtures thereof. In an embodiment, the oxidizer is hydrogen peroxide.

In some embodiments, the amount of oxidizer has an effect on the properties of the polishing composition, such as Mo RR, Mo SER, and TEOS RR. As discussed herein, the oxidizer also has an effect on the corrosion of Mo. The amount of oxidizer may range from about 0.1% to about 10%, from about 0.25% to about 7.5%, from about 0.5% to about 5%, or from about 1% to about 2.5%. In an embodiment, the oxidizer is in an amount of about 0.1 wt % to about 2.5 wt %. In some embodiments, the oxidizer is present in an amount at about 0.1% or more, about 0.25% or more, about 0.5% or more, about 1% or more, about 1.5% or more, or about 3% or more. In some embodiments, the oxidizer is present in an amount of 5% or less, about 3.5% or less, about 2% or less, about 1.5% or less, or about 1.0% or less. In some embodiments, the oxidizer is present in an amount of about 0.5%, about 1.0%, about 1.5%, about 3% or about 5%.

The percentage of oxidizer is measured with respect to the entire composition. Further, the percentage of oxidizer is measured as a Point Of Use (POU) composition. As used herein, the term "point of use" refers to a composition that is prepared and to be used in proximity to the planarization machine that supplies planarization fluid to an individual planarization machine for use in the CMP process.

4. Organic Acid

In some embodiments of the polishing compositions comprising an iron salt and an oxidizer, decomposition of the oxidizer was observed. The addition of an organic acid to the polishing composition effectively stabilizes the oxidizer and reduces the decomposition of the oxidizer.

As used herein, the term "organic acid" refers to a low molecular weight carboxylic acid, which may have more than one carboxylic acid moiety. The "organic acid" therefore includes any compound of the type R—COOH where R— is an organic radical, where di- and poly-basic acids are also included. The organic acids may be used in their conjugate form, e.g., the carboxylate can be used instead of the carboxylic acid. For purposes of this application, the term "organic acid" also means the conjugate base of the organic acid. For example, the term "malonic acid" includes neutral malonic acid and its conjugate base. Organic acids can be used alone or in combination.

As used in the organic acid, the organic radical may be an alkyl, aryl, heteroaryl, or the like.

As used herein, the term "alkyl" refers to a straight or branched chain hydrocarbon containing from one to 10 carbon atoms. Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, n-decyl, and the like. These alkyl groups may be substituted with additional groups.

As used herein, the term "aryl" refers to a hydrocarbon monocyclic, bicyclic or tricyclic aromatic ring system. As used herein, bicyclic and tricyclic aromatic ring systems may collectively be referred to as "multicyclic." Aryl groups may be optionally substituted with one or more substituents. Examples of aryl groups include phenyl, naphthyl, anthracenyl, fluorenyl, indenyl, azulenyl, and the like.

As used herein, the term "heteroaryl" refers to a monovalent aromatic radical of 5- or 6-membered rings, and includes fused ring systems (at least one of which is aromatic) of 5-20 atoms, containing one or more heteroatoms independently selected from nitrogen, oxygen, and sulfur. Examples of heteroaryl groups are pyridinyl (including, for example, 2-hydroxypyridinyl), imidazolyl, imidazopyridinyl, pyrimidinyl (including, for example, 4-hydroxypyrimidinyl), pyrazolyl, triazolyl (including, for example, 3-amino-1,2,4-triazole or 3-mercapto-1,2,4-triazole), pyrazinyl (including, for example, aminopyrazine), tetrazolyl, furyl, thienyl, isoxazolyl, thiazolyl, oxadiazolyl, oxazolyl, isothiazolyl, pyrrolyl, quinolinyl, isoquinolinyl, tetrahydroisoquinolinyl, indolyl, benzimidazolyl, benzofuranyl, cinnolinyl, indazolyl, indolizinyl, phthalazinyl, pyridazinyl, triazinyl, isoindolyl, pteridinyl, purinyl, thiadiazolyl, furazanyl, benzofurazanyl, benzothiophenyl, benzothiazolyl, benzoxazolyl, quinazolinyl, quinoxalinyl, naphthyridinyl, oxazol-2(3H)-onyl, and furopyridinyl. The heteroaryl groups are thus, in some embodiments, monocyclic or bicyclic. Heteroaryl groups are optionally substituted.

As used herein, the term "substituted" refers to a moiety (such as an alkyl group), wherein the moiety is bonded to one or more additional organic radicals. In some embodiments, the substituted moiety comprises 1, 2, 3, 4, or 5 additional substituent groups or radicals. Suitable organic substituent radicals include, but are not limited to, hydroxyl, amino, mono-substituted amino, di-substituted amino, mercapto, alkylthio, alkoxy, substituted alkoxy or haloalkoxy radicals. When a substituted moiety is bonded thereon with more than one substituent radical, then the substituent radicals may be the same or different.

Non-limiting examples of organic acids include formic acid, acetic acid, chloroacetic acid, propionic acid, butanoic acid, valeric acid, 2-methylbutyric acid, N-hexanoic acid, 3,3-dimethylbutanoic acid, 2-ethylbutanoic acid, 4-methylpentanoic acid, n-heptanoic acid, 2-methyl hexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citrate, citric acid, lactic acid, diglycolic acid, 2-furancarboxylic acid, 3-furancarboxylic acid, 2-tetrahydro furancarboxylic acid, methoxy acetic acid, methoxyphenyl acetic acid, and phenoxyacetic acid. In some embodiments, the organic acid is malonic acid.

The organic acid may be present in a range from about 0.001 wt % to about 0.1 wt %, from about 0.005 wt % to about 0.05 wt %, or from about 0.01 wt % to about 0.025 wt %. In some embodiments, the organic acid is present in an amount at least about 0.001 wt %, at least about 0.005 wt %, at least about 0.01 wt %, at least about 0.05 wt %, or at least about 0.01 wt %. In some embodiments, the organic acid is present in an amount of less than about 0.1 wt %, less than about 0.05 wt %, less than about 0.01 wt %, or less than about 0.005 wt %. In some embodiments, the organic acid is present in an amount that is about 0.001 wt %, about 0.005 wt %, about 0.01 wt %, about 0.012 wt %, about 0.015 wt %, about 0.02 wt %, about 0.025 wt %, or about 0.05 wt %.

5. Corrosion Inhibitor

The polishing composition described herein contains a corrosion inhibitor. In some embodiments, the corrosion inhibitor is an amino acid. As used herein, amino acids are organic compounds that contain amino (—NH$_2$) and carboxyl (—COOH) functional groups, along with a side chain (R group) specific to each amino acid. A generic, non-limiting, structure of an amino acid is provided below:

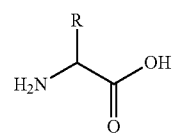

[Formula 1]

The amino acids are not limited to the generic structure above, and include amino acids which include, but are not limited to, other amino acids such as those pictured below:

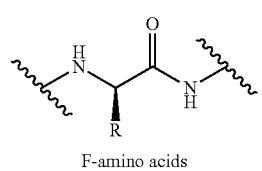

[Formula 2]

F-amino acids

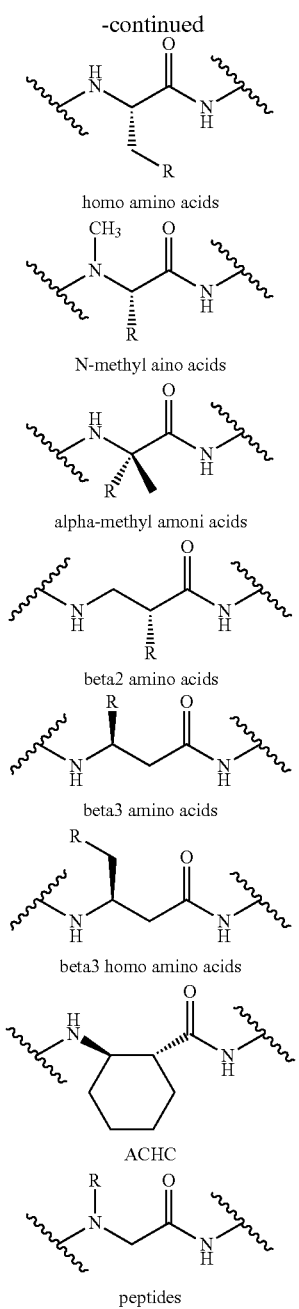

homo amino acids

N-methyl aino acids alpha-methyl amoni acids beta2 amino acids beta3 amino acids beta3 homo amino acids

ACHC peptides

In some embodiments, the corrosion inhibitor is a positively charged amino acid. The term "charged amino acid" as used herein refers to amino acid residues with electrically charged side-chains at pH relevant to the polishing compositions disclosed herein. The term a "charged amino acid" may refer to amino acids with either a positively charged side-chain, such as present in arginine (Arg, R), histidine (His, I) and lysine (Lys, K), or a negatively charged side-chain, such as present in aspartic acid (Asp, D) and glutamic acid (Glu, E). The term "positively charged amino acid" thus refers to an amino acid such as arginine (Arg, R), histidine (His, I) and lysine (Lys, K).

The term "neutral amino acid residue" as used herein refers to all other amino acids that do not carry electrically charged side-chains at relevant pH. Non-limiting neutral amino acids include serine (Ser, S), threonine (Thr, T), asparagine (Asn, N), glutamine (Glu, Q), Cysteine (Cys, C), glycine (Gly, G), proline (Pro, P), alanine (Ala, A), valine (Val, V), isoleucine (Ile, I), leucine (Leu, L), methionine (Met, M), phenylalanine (Phe, F), tyrosine (Tyr, Y), and tryptophan (Trp, T).

In some embodiments, the corrosion inhibitor is a positively charged amino acid. In further embodiments, this amino acid is selected from the group consisting of arginine, histidine, and lysine.

The amino acid may be present in the polishing composition. In some embodiments, the amount of amino acid in the polishing composition is in a range from about 0.01 wt % to about 0.5 wt %, about 0.05 wt % to about 0.25 wt %, or from about 0.075 wt % to about 0.15 wt %. In an embodiment, the amount of amino acid is about 0.01 wt % to about 0.15 wt %. In some embodiments, the amino acid is present in an amount of about 0.01 wt % or more, about 0.05 wt % or more, about 0.1 wt % or more, or about 0.2 wt % or more. Alternatively, or in addition, the amount of amino acid present in the polishing composition can be about 0.5 wt % or less, about 0.25 wt % or less, about 0.1 wt % or less, or about 0.05 wt % or less. In some embodiments, the amount of amino acid is present in an amount of about 0.01 wt %, about 0.05 wt %, about 0.075 wt %, about 0.1 wt %, or about 0.2 wt %.

6. pH-Adjusting Agent

The polishing compositions described herein may also contain a pH-adjusting agent. The pH-adjusting agent is not particularly limited. However, the pH of the polishing composition has a direct effect on the effectiveness of the polishing composition.

In some embodiments, the pH-adjusting agent may be acidic in nature. Accordingly, the pH-adjusting agent is preferably an acid. The choice of acid is not particularly limited provided that the strength of the acid is sufficient to lower the pH of the polishing composition of the present invention. For example, and without limitation, such acids include hydrochloric acid, sulfuric acid, nitric acid, boric acid, carbonic acid, hypophosphorous acid, phosphorous acid, and phosphoric acid. In an embodiment, the pH-adjusting agent is nitric acid.

In some embodiments, the pH of the polishing composition is adjusted to a range from about 2.0 to about 5.0, from about 2.25 to about 4.0, or from about 2.5 to about 3.0. In some embodiments, the pH is less than about 5.0, less than about 4.5, less than about 4.0, less than about 3.5, or less than about 3.0. In some embodiments, the pH is more than about 2.0, more than about 2.5, more than about 3.5, more than about 4.0, or more than about 4.5. In some embodiments, the pH is about 2.0, 2.25, 2.5, 2.70, 2.75, 3.0, 3.25, 3.5, 3.75, 4.0, 4.25, 4.5, 4.75, or 5.0. In an embodiment, the pH is about 2.7. In an embodiment, the pH of the polishing composition is about 2 to about 4.

The pH-adjusting agent may be present at a specific concentration range, regardless of pH. For example, in some embodiments, the amount of pH-adjusting agent is in a range from about 0.01 wt % to about 1 wt %, from about 0.02 wt % to about 0.5%, or from about 0.03 wt % to about 0.1 wt %. In an embodiment, the amount of the pH-adjusting agent is about 0.01 wt % to about 0.1 wt %. In some embodiments, the amount of pH-adjusting agent is present in an amount of at least about 0.01 wt %, at least about 0.02 wt %, at least about 0.03 wt %, at least about 0.04 wt %, at least about 0.05 wt %, at least about 0.06 wt %, or at least about 0.07 wt %. In some embodiments, the pH-adjusting agent is present in an amount of less than about 1 wt %, less than about 0.5 wt %, less than about 0.1 wt %, or less than about 0.05 wt %.

In some embodiments, the pH-adjusting agent is present in an amount that is about 0.01 wt %, about 0.02 wt %, about 0.03 wt %, about 0.04 wt %, about 0.05 wt %, about 0.06 wt %, about 0.07 wt %, about 0.08 wt %, about 0.09 wt %, about 0.1 wt %, about 0.2 wt %, about 0.3 wt %, about 0.4 wt %, or about 0.44 wt %.

Without being bound by theory, it is believed that the pH of the composition affects the performance due to a variety of different reasons, such as the effect on the Fenton reaction. For example, at a low pH complexation of $Fe^{2+}$ may occur, which may reduce the amount of reactive species. A lower pH may also result in the scavenging of radical hydroxyl (i.e., OH) by excess H+, hence reducing its reaction rate. In contrast, at a high pH, the reaction may slow down due to precipitation of iron salts such as $Fe(OH)_3$, thus lowering the concentration of the $Fe^{3+}$ species in solution. Further, solubility of iron species is directly governed by the solution's pH. $Fe^{3+}$ is about 100 times less soluble than $Fe^{2+}$ at near-neutral pH. Under high pH conditions, the stability of the $H_2O_2$ is also affected, resulting in its self-decomposition.

Accordingly, the polishing compositions described herein have specific properties exemplified by their performance in Mo removal rate, Mo static etch rate, or TEOS removal rate.

For example, the polishing compositions described herein may have a Mo removal rate of at least about 100 Å/min, at least about 150 Å/min, at least about 180 Å/min, at least about 200 Å/min, at least about 250 Å/min, at least about 300 Å/min, at least about 400 Å/min, or at least about 500 Å/min. In some embodiments, the material removal rate is in a range from about 100 Å/min to about 500 Å/min, from about 150 Å/min to about 300 Å/min, or from about 180 Å/min to about 250 Å/min. In some embodiments, the material removal rate is about 100 Å/min, about 150 Å/min, about 180 Å/min, about 200 Å/min, about 250 Å/min, or about 300 Å/min.

The polishing compositions described herein may have a molybdenum (Mo) static etch rate of less than about 100, less than about 75, less than about 50, less than about 25, less than about 20, less than about 15, less than about 10, less than about 5, or less than about 1. In some embodiments, the static etch rate is about 5, about 10, about 15, or about 20.

The polishing compositions described herein may have a TEOS removal rate of less than about 100 Å/min, 90 Å/min, 80 Å/min, 70 Å/min, 60 Å/min, 50 Å/min, 40 Å/min, 30 Å/min, 20 Å/min, 10 Å/min, or 5 Å/min. In some embodiments, the polishing compositions described herein may have a TEOS removal rate of about 5 Å/min, about 5 Å/min, about 10 Å/min, about 20 Å/min, about 30 Å/min, about 40 Å/min, about 50 Å/min, about 60 Å/min, about 70 Å/min, or about 80 Å/min.

The polishing compositions described herein may have a ratio of Mo removal rate to Mo static etch rate of at least about 5, at least about 10, at least about 20, at least about 25, at least about 30, at least about 35, at least about 40, or at least about 50. In some embodiments, the ratio of Mo removal rate to Mo static etch rate is about 5, about 10, about 15, about 20, about 25, about 30, about 35, or about 40.

The polishing compositions described herein may have a ratio of Mo removal rate to TEOS removal rate of at least about 2, at least about 3, at least about 5, at least about 10, at least about 15, a least about 20, at least about 25, or at least about 30. In some embodiments, the ratio of Mo removal rate to TEOS removal rate is about 2, about 3, about 5, about 10, about 15, about 20, or about 25.

The polishing composition of claim 1, wherein the polishing composition has a Mo:TEOS removal rate selectivity of at least about 5.

7. Water

In an embodiment, the polishing compositions disclosed herein contain a carrier, medium, or vehicle. In an embodiment, the carrier, medium, or vehicle is water. Ion-exchanged water (deionized water), pure water, ultrapure water, distilled water and the like may be used as the water. In order to reduce the amount of unwanted components present in the water, the purity of water may be increased by operations such as removal of impurity ions with an ion exchange resin, removal of contaminants with a filter, and/or distillation.

In some embodiments, the water is relatively free of impurities. In some embodiments, the water contains less than about 10% w/w, about 9% w/w, about 8% w/w, about 7% w/w, about 6% w/w, about 5% w/w, about 4% w/w, about 3% w/w, about 2% w/w, about 1% w/w, about 0.9% w/w, about 0.8% w/w, about 0.7% w/w, about 0.6% w/w, about 0.5% w/w, about 0.4% w/w, about 0.3% w/w, or less than about 0.1% w/w of impurities based on the total weight of the water.

8. Additional Components

In an embodiment, the polishing compositions disclosed herein may contain additional components such as chelating agents, biocides, surfactants, or co-solvents. Additionally, or alternatively, the compositions disclosed herein can include other additives as will be understood by those skilled in the art.

In an embodiment, the additional component may include a chelating agent. The term chelating agent is intended to mean any substance that in the presence of an aqueous solution chelates metals, such as copper. Non-limiting examples of chelating agents include inorganic acids, organic acids, amines, and amino acids such as glycine, alanine, citric acid, maleic acid, oxalic acid, malonic acid, phthalic acid, succinic acid, nitrilotriacetic acid, iminodiacetic acid, ethylenediamine, ethylenediaminetetraacetic acid (EDTA), diethylenetriaminepentaacetic acid (DTPA), triethylenetetraminehexaacetic acid (TTHA), hydroxyethylidenediphosphonic acid (HEDP), nitrilotrismethylphosphonic acid (NTMP), phosphonobutanetricarboxylic acid (PBTC), and ethylenediaminetetramethylenephosphonic acid (EDTMP).

In an embodiment, the additional component may be a biocide. Non-limiting examples of biocides include hydrogen peroxide, quaternary ammonium compounds, and chlorine compounds. More specific examples of the quaternary ammonium compounds include, but are not limited to, methylisothiazolinone, tetramethylammonium chloride, tetraethylammonium chloride, tetmpropylammonium chloride, alkylbenzyldimethylammonium chloride, and alkylbenzyldimethylammonium hydroxide, wherein the alkyl chain ranges from 1 to about 20 carbon atoms. More specific examples of the chlorine compounds include, but are not limited to, sodium chlorite and sodium hypochlorite. Additional examples of biocides include biguanide, aldehydes, ethylene oxide, isothiazolinone, iodophor, Kordek™ MLX from DuPont (which is an aqueous composition of 2-methyl-4-isothiazolin-3-one), KATHON™ and NEOLENE™ product families that are commercially available from Dow chemicals, and the Preventol™ family from Lanxess. In an embodiment, the biocide is Kordek™ MLX. The amount of biocide used in the polishing composition may range from about 0.00005 wt % to 0.001 wt % or from about 0.0001 wt % to 0.0005 wt %. In some embodiments, the biocide is present in an amount about 0.0001 wt %, about 0.00013 wt %, or about 0.00015 wt %. In an embodiment, the biocide is present in an amount of about 0.0001 wt % to 0.001 wt % in the polishing composition.

In another embodiment, the additional component may include a surfactant. The surfactants may be anionic, cationic, nonionic, or zwitterionic and may increase lubricity of the vehicle or compositions. Non-limiting examples of the surfactants are dodecyl sulfates, sodium salts or potassium salts, lauryl sulfates, secondary alkane sulfonates, alcohol ethoxylate, acetylenic diol surfactant, quaternary ammonium-based surfactants, amphoteric surfactants, such as betaines and amino acid derivatives-based surfactants, and any combination thereof. Examples of suitable commercially available surfactants include TRITON™, TERGITOL™, and the DOWFAX™ family of surfactants manufactured by Dow Chemicals. Suitable surfactants of surfactants may also include polymers comprising ethylene oxide (EO) and propylene oxide (PO) groups. An example of EO-PO polymer is TETRONIC™ 90R4 from BASF Chemicals. The amount of surfactant used in the polishing composition may range from about 0.0005 wt % to 0.15 wt %, preferably from 0.001 wt % to 0.05 wt %, and more preferably from 0.0025 wt % to 0.025 wt %.

In another embodiment, the additional component may include another solvent, termed a co-solvent. Non-limiting examples of co-solvents include, but are not limited to, alcohol (such as methanol or ethanol), ethyl acetate, tetrahydrofuran, alkanes, tetrahydrofuran, dimethylformamide, toluene, ketones (such as acetone), aldehydes, and esters. Other non-limiting examples of co-solvents include dimethyl formamide, dimethyl sulfoxide, pyridine, acetonitrile, glycols, and mixtures thereof. The co-solvent may be employed in various amounts, preferably from a lower limit of about 0.0001, 0.001, 0.01, 0.1, 0.5, 1, 5, or 10% (wt %) to an upper limit of about 0.001, 0.01, 0.1, 1, 5, 10, 15, 20, 25, or 35% (wt %).

As described herein, the polishing compositions have specific properties, which are greatly influenced by the components in the composition, both in type and amount. Thus, certain materials may need to be excluded from the composition in order to maintain the desired properties.

The polishing slurries of the invention can be prepared by any suitable technique, many of which are known to those skilled in the art. The polishing composition can be prepared in a batch or a continuous process. Generally, the polishing composition can be prepared by combining the components disclosed herein in any order. The term "component" as used herein includes individual ingredients (e.g., abrasive, molybdenum removal rate enhancer, oxidizer, organic acid, corrosion inhibitor, and the like), as well as any combination of ingredients. For example, the abrasive can be dispersed in water, the molybdenum removal rate enhancer, and any other additive material can be added, and mixed by any method that is capable of incorporating the components into the polishing composition. The pH can be further adjusted, if desired, at any suitable time by addition of an acid, base or a buffer, as needed.

In some embodiments, the polishing composition is stable for at least 1, 2, 3, 4, 5, 6, or 7 days at 50° C. In some embodiments, the polishing composition is stable for at least 1 week, at least 2 weeks, at least 3 weeks, or at least 4 weeks at 50° C. The stability of the polishing composition can be evaluated by calculating ([B]−[T])/[C] described above. For example, ([B]−[T])/[C] for the polishing composition is preferably less than or equal to 0.5, more preferably less than or equal to 0.3, even more preferably less than or equal to 0.1, more preferably less than or equal to 0.05, even more preferably 0.04, and most preferably less than or equal to 0.03.

Accordingly, as described herein, in some embodiments are polishing compositions comprising an abrasive, a molybdenum removal rate enhancer, an organic acid, an oxidizer, a corrosion inhibitor, and water, wherein the abrasive is cation-modified silica; the molybdenum removal rate enhancer is an iron salt; the oxidizer is a peroxide; and the corrosion inhibitor is a positively charged amino acid; wherein the polishing composition has a pH from about 2 to about 5.

As in any embodiment above, a polishing composition wherein the cation-modified silica is present in a concentration of about 0.1 wt % to about 1.5 wt %.

As in any embodiment above, a polishing composition wherein the iron salt is present in a concentration of about 0.0001 wt % to about 0.0007 wt %.

As in any embodiment above, a polishing composition wherein the peroxide is present in a concentration of about 0.1 wt % to about 2.5 wt %.

As in any embodiment above, a polishing composition wherein the positively charged amino acid is present in a concentration of about 0.01 wt % to about 0.15 wt %.

As in any embodiment above, a polishing composition wherein the surface of the cation-modified silica has amino groups covalently attached.

As in any embodiment above, a polishing composition wherein the iron salt is selected from the group consisting of iron (III) nitrate, iron (II) sulfate, and iron (III) sulfate.

As in any embodiment above, a polishing composition wherein the organic acid is malonic acid.

As in any embodiment above, a polishing composition wherein the peroxide is hydrogen peroxide.

As in any embodiment above, a polishing composition wherein the positively charged amino acid is selected from the group consisting of lysine, histidine, and arginine.

As in any embodiment above, a polishing composition further comprising a pH-adjusting agent. In a further embodiment, a polishing composition wherein the pH-adjusting agent is an acid present in a concentration from about 0.01 wt % to about 0.10 wt %. In a further embodiment, the acid is nitric acid.

As in any embodiment above, a polishing composition wherein the pH is from about 2 to about 4.

As in any embodiment above, a polishing composition further comprising a biocide present in a concentration of about 0.0001 wt % to about 0.001 wt %.

As in any embodiment above, a polishing composition wherein the abrasive has a positive zeta potential in a range from about +10 mV to about +50 mV.

As in any embodiment above, a polishing composition wherein the polishing composition has a molybdenum static etch rate of less than about 20.

As in any embodiment above, a polishing composition wherein the polishing composition has a molybdenum removal rate of at least about 200 Å/min.

As in any embodiment above, a polishing composition wherein the polishing composition has a TEOS removal rate of less than about 50 Å/min.

As in any embodiment above, a polishing composition wherein the polishing composition has a ratio of molybdenum removal rate to molybdenum static etch rate of at least about 20.

As in any embodiment above, a polishing composition wherein the polishing composition has a Mo:TEOS removal rate selectivity of at least about 4.5.

As in any embodiment above, a polishing composition wherein the polishing composition is stable for a period of at least one week. In an embodiment, the pH of the composition remains unchanged after a period of at least one week. In another embodiment, the electrical conductivity (EC) of the composition remains unchanged after a period of at least one week. In some embodiments, the electrical conductivity is from greater than zero to about 1.0 mS/cm, from greater than zero to about 0.50 mS/cm, from greater than zero to about 0.25 mS/cm, from greater than zero to about 0.15 mS/cm, from greater than zero to about 0.10 mS/cm, from greater than zero to about 0.05 mS/cm, or from greater than zero to about 0.03 mS/cm. In some embodiments, the electrical conductivity is from about 0.01 mS/cm to about 1.0 mS/cm, from about 0.02 mS/cm to about 0.50 mS/cm, or from about 0.03 mS/cm to about 0.1 mS/cm. In some embodiments, the electrical conductivity is about 0.02, 0.03, 0.04, 0.05, 0.06, 0.07, 0.08, 0.09, 0.10, 0.11, 0.12, 0.13, 0.14, or 0.15 mS/cm. In some embodiments, the upper limit of the electrical conductivity is about 0.25 mS/cm, about 0.20 mS/cm, about 0.18 mS/cm, about 0.16 mS/cm, about 0.14 mS/cm, about 0.12 mS/cm, about 0.10 mS/cm, about 0.08 mS/cm, about 0.07 mS/cm, about 0.06 mS/cm, about 0.05 mS/cm, about 0.04 mS/cm, or about 0.03 mS/cm. In a further embodiment, the electrical conductivity is in the range from about 0.2 mS/cm to about 1.0 mS/cm.

As in any embodiment above, a polishing composition wherein the surface of the cation-modified silica has amino groups covalently attached, the molybdenum removal rate enhancer is iron (II) nitrate, the oxidizer is hydrogen peroxide, the organic acid is malonic acid, and the corrosion inhibitor is arginine.

Further, in some embodiments are a polishing composition comprising an abrasive, a molybdenum removal rate enhancer, an organic acid, an oxidizer, a corrosion inhibitor, and water, wherein the abrasive is cation-modified silica present in a concentration of about 0.1 wt % to about 1.5 wt %; the molybdenum removal rate enhancer is an iron salt present in a concentration of from about 0.0001 wt % to about 0.0007 wt %; the oxidizer is a peroxide present in a concentration of about 0.1 wt % to about 2.5 wt %; and the corrosion inhibitor is a positively charged amino acid present in a concentration of about 0.01 wt % to about 0.15 wt %; wherein the polishing composition has a pH from about 2 to about 4.

As in any embodiment above, a polishing composition wherein the iron salt is selected from the group consisting of iron (III) nitrate, iron (II) sulfate, and iron (III) sulfate; the organic acid is malonic acid; the peroxide is hydrogen peroxide; and the positively charged amino acid is selected from the group consisting of lysine, histidine, and arginine.

As in any embodiment above, a polishing composition further comprising a pH-adjusting agent present in a concentration from about 0.01 wt % to about 0.10 wt %.

As in any embodiment above, a polishing composition wherein the pH-adjusting agent is nitric acid.

C. Methods of Using the Polishing Compositions

The polishing compositions described herein are useful for polishing any suitable substrate. In an embodiment, the substrate to be polished can be any suitable substrate, which comprises at least one layer of molybdenum. Suitable substrates include, but are not limited to, flat panel displays, integrated circuits, memory or rigid disks, metals, interlayer dielectric (ILD) devices, semiconductors, microelectromechanical systems, ferroelectrics, and magnetic heads.

As another example, the polishing composition can be used to polish a substrate comprising a silicon oxide layer. In another embodiment, the polishing composition can be used to polish a substrate comprising a silicon layer. Suitable substrates include, but are not limited to, flat panel displays, integrated circuits, memory or rigid disks, metals, semiconductors, ILD devices, microelectromechanical systems (MEMS), ferroelectrics, and magnetic heads.

The substrate can further comprise at least one other layer, e.g., an insulating layer. The insulating layer can be a metal oxide, porous metal oxide, glass, organic polymer, fluorinated organic polymer, or any other suitable high- or low-K insulating layer. The insulating layer can comprise, consist essentially of, or consist of silicon oxide, SiN, or combinations thereof. The silicon oxide layer can comprise, consist essentially of, or consist of any suitable silicon oxide, many of which are known in the art. For example, the silicon oxide layer can comprise tetraethoxysilane (TEOS), high density plasma (HDP) oxide, borophosphosilicate glass (BPSG), high aspect ratio process (HARP) oxide, spin-on dielectric (SOD) oxide, chemical vapor deposition (CVD) oxide, plasma-enhanced tetraethyl orthosilicate (PETEOS), thermal oxide, or undoped silicate glass. In a specific embodiment, the silicon oxide layer is tetraethoxysilane (TEOS). The substrate can further comprise a metal layer. In a specific embodiment, the metal layer is molybdenum.

Accordingly, as described herein, in some embodiments are methods of using the polishing compositions, where the methods comprise the steps of: a) providing the polishing composition described herein of claim 1; b) providing a substrate, wherein the substrate comprises a molybdenum containing layer; and c) polishing the substrate with the polishing composition to provide a polished substrate.

As in any embodiment above, a method wherein the substrate is a semiconductor.

As in any embodiment above, a method wherein the substrate further comprises a silicon oxide layer.

As in any embodiment above, a method wherein the method results in a Mo:TEOS removal rate selectivity ratio of greater than about 5.

As in any embodiment above, a method wherein the method results in a Mo static etching rate of less than about 20.

D. Examples

The following preparations and examples are given to enable those skilled in the art to more clearly understand and to practice the present invention. They should not be considered as limiting the scope of the invention, but merely as being illustrative and representative.

In one aspect, disclosed are methods of making the polishing compositions. In another aspect are disclosed methods of using the polishing compositions to polish materials.

Example 1: Polishing Conditions

Materials and Tools Used:
<Polishing Conditions>
  Polisher: ALLIED Precision Polisher MultiPrep System (Allied High Tech Products, Inc.)
  Platen rotation speed: 200 rpm
  Head rotation speed: 60 rpm
  Flow rate: 15 mL/min
  Down force: 1.5 psi
  Polishing time: 60 sec Pad: Visionpad 6000 manufactured by DuPont de Nemours, Inc.
Dilution factor: 6×
<Conditions for Static Etch Rate>
25° C. for 1 min
Mo coupon: 2 kA Mo wafer (manufactured by Advantiv Technologies, Inc.) (Si substrate of 1.5 in in length×1.5 in in width×about 780 μm in thickness with molybdenum film of 2000 Å in thickness formed thereon)

Example 2: Polishing Experiment

The following TEOS substrate and Mo substrate were polished with each of slurries listed in Tables 1A to 5 Å under the above polishing conditions.
TEOS substrate: 10 kA TEOS wafer (manufactured by Advantiv Technologies, Inc.) (Si substrate of 1.5 in in length×1.5 in in width×about 780 μm in thickness with TEOS film of 10000 Å in thickness formed thereon)
Mo substrate: 2 kA Mo wafer (manufactured by Advantiv Technologies, Inc.) (Si substrate of 1.5 in in length×1.5 in in width×about 780 μm in thickness with molybdenum film of 2000 Å in thickness formed thereon)
[Polishing Speed]
For polishing speed, the decrease of thickness through polishing (Å) was calculated by measuring the mean of thickness values at 17 points in the surface of each substrate before and after polishing by using a ResMap (manufactured by Creative Design Engineering, Inc.), and the decrease of thickness through polishing (Å) was divided by the polishing time (min) to calculate the polishing speed.
[Static Etch Rate]
Etching was performed for a Mo coupon with each of slurries listed in Tables 1A to 5A under the above conditions for static etch rate. For static etch rate, the decrease of thickness through etching (Å) was calculated by measuring the thickness before and after etching by using a ResMap (manufactured by Creative Design Engineering, Inc.), and the decrease of thickness through etching (Å) was divided by the etching time (min) to calculate the static etch rate.
[Preparation of Slurries A to V]
Slurries A to V listed in Tables 1A to 5A were prepared. Each of slurries A to V was prepared by mixing a positively charged high purity colloidal silica where the surface was modified with an aminosilane (product name: PL-3C (manufactured by Fuso Chemical Industry Co., Ltd.), secondary particle size: 70 nm, surface area: 80 m$^2$/g) as an abrasive, ferric nitrate as a molybdenum removal rate enhancer, a compound listed in Tables 1A to 5 Å as a corrosion inhibitor, malonic acid as an organic acid, hydrogen peroxide as an oxidizer, 1,2-benzothiazolin-3-one as a biocide, nitric acid as a pH-adjusting agent, and water (deionized water) as a dispersing medium, with the total of the slurry assumed as 100 parts by weight. The loadings (contents) of the components were the amounts (wt % to the total weight of slurry) listed in Tables 1A to 5A, and the loadings (contents) of the pH-adjusting agent were amounts that provided slurries A to V with pH 2.7 (liquid temperature: 25° C.). The zeta potentials of the abrasive in slurries A to V were +20 to +50 mV. Each of slurries A to S contains 1.53 wt % of hydrogen peroxide, which is not shown in Tables 1A to 4A. The amounts of the components in Tables 1A to 5A each indicate wt % to the total weight of slurry (100 wt %), and simply expressed as "%" in the tables.
[Evaluation Results]
As illustrated in Tables 1A and 1B, amino acids were screened as corrosion inhibitors for Mo. The ratio of Mo RR and Mo static etch rate (SER) ("Mo SER/Mo RR ratio") was used as a parameter to determine the performance of the slurry formulation. The higher the value of the Mo SER/Mo RR ratio, the more preferable the formulation, due to a lower SER and a higher Mo RR. It was determined that positively charged amino acids such as arginine, histidine and lysine are good corrosion inhibitors for Mo. For example, the Mo RR/Mo SER ratio observed in slurries C, D, and E was higher than the other slurries. Further, slurries C and D produced the lowest Mo SER among the slurries evaluated in Table 1B. The slurries containing neutral amino acids such as glycine, cysteine, serine, proline, valine or alanine all produced a high Mo SER.
Of additional note is that the addition of malonic acid increased Mo SER from 94 Å/min to 154 Å/min (Slurry A and B, respectively). The slurries in Table 1A all contain the positively charged high purity colloidal silica PL-3C as an abrasive. All concentrations are based on a POU formulation. All slurries contain hydrogen peroxide at a concentration of 1.53 wt % at POU.
Table 1

TABLE 1A

| Slurry | Abrasive (%) | Nitric acid (%) | Ferric Nitrate (%) | Corrosion inhibitor | charge | % | Malonic acid (%) | Biocide (%) |
|---|---|---|---|---|---|---|---|---|
| Slurry A | 1.35 | 0.037 | 0.00031 | None | — | 0 | 0 | 0.00013 |
| Slurry B | 1.35 | 0.034 | 0.00031 | None | — | 0 | 0.012 | 0.00013 |
| Slurry C | 1.35 | 0.078 | 0.00031 | L-Arginine | Positive | 0.098 | 0.012 | 0.00013 |
| Slurry D | 1.35 | 0.077 | 0.00031 | L-Histidine | Positive | 0.098 | 0.012 | 0.00013 |
| Slurry E | 1.35 | 0.070 | 0.00031 | L-Lysine | Positive | 0.098 | 0.012 | 0.00013 |
| Slurry F | 1.35 | 0.075 | 0.00031 | Glycine | Neutral | 0.098 | 0.012 | 0.00013 |
| Slurry G | 1.35 | 0.041 | 0.00031 | Cysteine | Neutral | 0.098 | 0.012 | 0.00013 |
| Slurry H | 1.35 | 0.048 | 0.00031 | Serine | Neutral | 0.098 | 0.012 | 0.00013 |
| Slurry I | 1.35 | 0.043 | 0.00031 | Proline | Neutral | 0.098 | 0.012 | 0.00013 |
| Slurry J | 1.35 | 0.048 | 0.00031 | Valine | Neutral | 0.098 | 0.012 | 0.00013 |
| Slurry K | 1.35 | 0.440 | 0.00031 | Alanine | Neutral | 0.098 | 0.012 | 0.00013 |

TABLE 1B

| Slurry | Mo SER (RT for 1 min) | Mo RR (Å/min) | TEOS RR (Å/min) | [Mo RR]/ [Mo SER] | [Mo RR]/ [TEOS RR] |
|---|---|---|---|---|---|
| Slurry A | 94 | 477 | 49 | 5.1 | 9.8 |
| Slurry B | 154 | 514 | 39 | 3.3 | 13.2 |
| Slurry C | 9 | 223 | 46 | 25.1 | 4.9 |
| Slurry D | 7 | 273 | 31 | 40.8 | 8.8 |
| Slurry E | 12 | 181 | 25 | 14.9 | 7.2 |
| Slurry F | 88 | 413 | 44 | 4.7 | 9.3 |
| Slurry G | 38 | 414 | 41 | 10.9 | 10.2 |

TABLE 1B-continued

| Slurry | Mo SER (RT for 1 min) | Mo RR (Å/min) | TEOS RR (Å/min) | [Mo RR]/ [Mo SER] | [Mo RR]/ [TEOS RR] |
|---|---|---|---|---|---|
| Slurry H | 111 | 405 | 24 | 3.6 | 16.7 |
| Slurry I | 127 | 537 | 52 | 4.2 | 10.3 |
| Slurry J | 145 | 489 | 32 | 3.4 | 15.1 |
| Slurry K | 123 | 575 | 33 | 4.7 | 17.6 |

Tables 2A and 2B describe the particle concentration effect from slurry C as a base formulation. The particle concentration of slurry indicates the abrasive concentration. The slurries in Table 2A all contain the positively charged high purity colloidal silica PL-3C (Fuso Chemical Industry Co., Ltd.) as an abrasive. As observed in Table 2B, TEOS RR and Mo SER increases with increasing particle concentration. All concentrations are based on a POU formulation. All slurries contain hydrogen peroxide at a concentration of 1.53 wt % at POU.
Table 2

TABLE 2A

| Slurry | Abrasive (%) | Nitric acid (%) | Ferric Nitrate (%) | Corrosion inhibitor | Corrosion inhibitor charge | % | Malonic acid (%) | Biocide (%) |
|---|---|---|---|---|---|---|---|---|
| Slurry C | 1.35 | 0.078 | 0.00031 | L-Arginine | Positive | 0.098 | 0.012 | 0.00013 |
| Slurry L | 3.00 | 0.078 | 0.00031 | L-Arginine | Positive | 0.098 | 0.012 | 0.00013 |

TABLE 2B

| Slurry | Mo SER (RT for 1 min) | Mo RR (Å/min) | TEOS RR (Å/min) | [Mo RR]/ [Mo SER] | [Mo RR]/ [TEOS RR] |
|---|---|---|---|---|---|
| Slurry C | 9 | 223 | 46 | 25.1 | 4.9 |
| Slurry L | 10 | 315 | 86 | 33.1 | 3.7 |

Tables 3A and 3B show the effect of ferric nitrate concentration. The slurries in Table 3A all contain the positively charged high purity colloidal silica PL-3C (Fuso Chemical Industry Co., Ltd.) as an abrasive. As shown in Table 3B, the Mo SER was reduced by increasing ferric nitrate concentration. The ratio of Mo RR/Mo SER was the highest in slurry C, primarily due to the low Mo SER. This result shows that increasing ferric nitrate concentration improves etching performance. Increasing the ferric nitrate concentration by more than two-fold (slurry O) did not further reduce Mo SER. All concentrations are based on a POU formulation. All slurries contain hydrogen peroxide at a concentration of 1.53 wt % at POU.
Table 3

TABLE 3A

| Slurry | Abrasive (%) | Nitric acid (%) | Ferric Nitrate (%) | Corrosion inhibitor | Corrosion inhibitor charge | % | Malonic acid (%) | Biocide (%) |
|---|---|---|---|---|---|---|---|---|
| Slurry M | 1.35 | 0.075 | 0 | L-Arginine | Positive | 0.098 | 0.012 | 0.00013 |
| Slurry N | 1.35 | 0.078 | 0.00016 | L-Arginine | Positive | 0.098 | 0.012 | 0.00013 |
| Slurry C | 1.35 | 0.078 | 0.00031 | L-Arginine | Positive | 0.098 | 0.012 | 0.00013 |
| Slurry O | 1.35 | 0.074 | 0.00070 | L-Arginine | Positive | 0.098 | 0.012 | 0.00013 |

TABLE 3B

| Slurry | Mo SER (RT for 1 min) | Mo RR (Å/min) | TEOS RR (Å/min) | [Mo RR]/ [Mo SER] | [Mo RR]/ [TEOS RR] |
|---|---|---|---|---|---|
| Slurry M | 141 | 261 | 39 | 1.8 | 6.6 |
| Slurry N | 15 | 264 | 39 | 17.8 | 6.7 |
| Slurry C | 9 | 223 | 46 | 25.1 | 4.9 |
| Slurry O | 17 | 272 | 37 | 16.1 | 7.4 |

Tables 4A and 4B describe the effect of arginine concentration. The slurries in Table 4 Å all contain the positively charged high purity colloidal silica PL-3C as an abrasive. As arginine concentration increases, Mo RR, Mo SER and TEOS RR decrease. The ratio of Mo RR/Mo SER from slurry C is highest among the slurries shown in Table 4A. The ratio of Mo RR/Mo SER from slurry R is lower than slurry C, an effect believed (without being bound by theory) to be due to reduction of Mo RR resulting from an increased concentration of corrosion inhibitor. All concentrations are based on a POU formulation. All slurries contain hydrogen peroxide at a concentration of 1.53 wt % at POU.

Table 4

TABLE 4A

| Slurry | Abrasive (%) | Nitric acid (%) | Ferric Nitrate (%) | Corrosion inhibitor | charge | % | Malonic acid (%) | Biocide (%) |
|---|---|---|---|---|---|---|---|---|
| Slurry B | 1.35 | 0.034 | 0.00031 | None | — | 0 | 0.012 | 0.00013 |
| Slurry P | 1.35 | 0.043 | 0.00031 | L-Arginine | Positive | 0.020 | 0.012 | 0.00013 |
| Slurry Q | 1.35 | 0.042 | 0.00031 | L-Arginine | Positive | 0.059 | 0.012 | 0.00013 |
| Slurry C | 1.35 | 0.078 | 0.00031 | L-Arginine | Positive | 0.098 | 0.012 | 0.00013 |
| Slurry R | 1.35 | 0.057 | 0.00031 | L-Arginine | Positive | 0.196 | 0.012 | 0.00013 |

TABLE 4B

| Slurry | Mo SER (RT for 1 min) | Mo RR (Å/min) | TEOS RR (Å/min) | [Mo RR]/ [Mo SER] | [Mo RR]/ [TEOS RR] |
|---|---|---|---|---|---|
| Slurry B | 154 | 514 | 39 | 3.3 | 13.2 |
| Slurry P | 24 | 389 | 62 | 16.0 | 6.3 |
| Slurry Q | 21 | 284 | 49 | 13.5 | 5.8 |
| Slurry C | 9 | 223 | 46 | 25.1 | 4.9 |
| Slurry R | 11 | 153 | 46 | 13.8 | 3.3 |

Tables 5A and 5B describe the effect of oxidizer (such as hydrogen peroxide) concentration on previously prepared slurry C. The slurries in Table 5A all contain the positively charged high purity colloidal silica PL-3C as an abrasive. As the oxidizer concentration increases, both Mo SER and Mo RR increase. An oxidizer concentration of 1.53 wt % provided the highest the ratio of Mo RR/Mo SER. All concentrations are based on a POU formulation.

Table 5.

TABLE 5A

Effect of hydrogen peroxide

| Slurry | Abrasive (%) | Nitric acid (%) | Ferric Nitrate (%) | Corrosion inhibitor | charge | % | Malonic acid (%) | Biocide (%) | $H_2O_2$ (%) |
|---|---|---|---|---|---|---|---|---|---|
| Slurry S | 1.35 | 0.078 | 0.00031 | L-Arginine | Positive | 0.098 | 0.012 | 0.00013 | 0% |
| Slurry T | 1.35 | 0.078 | 0.00031 | L-Arginine | Positive | 0.098 | 0.012 | 0.00013 | 0.50% |
| Slurry C | 1.35 | 0.078 | 0.00031 | L-Arginine | Positive | 0.098 | 0.012 | 0.00013 | 1.53% |
| Slurry U | 1.35 | 0.078 | 0.00031 | L-Arginine | Positive | 0.098 | 0.012 | 0.00013 | 2.5% |
| Slurry V | 1.35 | 0.078 | 0.00031 | L-Arginine | Positive | 0.098 | 0.012 | 0.00013 | 3.5% |

TABLE 5B

| Slurry | Mo SER (RT for 1 min) | Mo RR (Å/min) | TEOS RR (Å/min) | [Mo RR]/ [Mo SER] | [Mo RR]/ [TEOS RR] |
|---|---|---|---|---|---|
| Slurry S | 4 | 13 | 57 | 3.0 | 0.2 |
| Slurry T | 7 | 160 | 53 | 22.4 | 3.0 |
| Slurry C | 9 | 223 | 46 | 25.1 | 4.9 |
| Slurry U | 18 | 317 | 48 | 17.3 | 6.6 |
| Slurry V | 24 | 376 | 42 | 15.7 | 8.9 |

Accordingly, as disclosed herein, are embodiments of formulations with positively charged amino acids as a corrosion inhibitor at pH 2.7 by using positively charged colloidal silica. In some embodiments, histidine, arginine and lysine were identified as corrosion inhibitors for Mo.

[Evaluation of Stability]

From each of slurries C to E, L, N, O to R, and T to V, a 100-mL portion was sampled and placed in a 100-mL graduated cylinder. Thereafter, they were allowed to stand without agitation for a time of two hours, and then the difference between the concentration of particles in the bottom 50 mL of the graduated cylinder ([B] in terms of g/mL) and the concentration of particles in the top 50 mL of the graduated cylinder ([T] in terms of g/mL) was divided by the total concentration of particles in the polishing composition ([C] in terms of g/mL) to calculate the value of ([B]−[T])/[C]. The values of ([B]−[T])/[C] for slurries C and D were each (0.00136−0.00134)/0.0135=0.0148. The values of ([B]−[T])/[C] for slurries E, L, N, O to R, and T to V were each less than or equal to 0.03.

After slurries C to E, L, N, O to R, and T to V each in an amount of about 1 kg were allowed to stand at 50° C. for 1 week, the state of each slurry was checked by visual observation. The results confirmed that slurries A to W had not undergone the precipitation of the abrasive, thus being homogeneous solutions. Accordingly, slurries C to E, L, N, O to R, and T to V were confirmed to be stable for 1 week at 50° C.

It will be apparent to those skilled in the art that various modifications and variations can be made in the present invention without departing from the scope or spirit of the invention. Other aspects of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A polishing composition comprising an abrasive, a molybdenum removal rate enhancer, an organic acid, an oxidizer, a corrosion inhibitor, and water, wherein
the abrasive is cation-modified silica;
the molybdenum removal rate enhancer is an iron salt present in a concentration of from about 0.0001 wt % to about 0.0007 wt %;
the oxidizer is a peroxide; and
the corrosion inhibitor is a positively charged amino acid;
wherein
the polishing composition has a pH from about 2 to about 5.

2. The polishing composition of claim 1, wherein the surface of the cation-modified silica has amino groups covalently attached.

3. The polishing composition of claim 1, wherein the iron salt is selected from the group consisting of iron (III) nitrate, iron (II) sulfate, and iron (III) sulfate.

4. The polishing composition of claim 1, wherein the peroxide is hydrogen peroxide.

5. The polishing composition of claim 1, wherein the positively charged amino acid is selected from the group consisting of lysine, histidine, and arginine.

6. The polishing composition of claim 1, further comprising a pH-adjusting agent.

7. The polishing composition of claim 1, further comprising nitric acid.

8. The polishing composition of claim 1, wherein the pH is from about 2 to about 4.

9. The polishing composition of claim 1, wherein the abrasive has a positive zeta potential in a range from about +10 mV to about +50 mV.

10. The polishing composition of claim 1, wherein
the surface of the cation-modified silica has amino groups covalently attached;
the molybdenum removal rate enhancer is iron (II) nitrate;
the oxidizer is hydrogen peroxide;
the organic acid is malonic acid; and
the corrosion inhibitor is arginine.

11. The polishing composition of claim 1, wherein
the iron salt is selected from the group consisting of iron (III) nitrate, iron (II) sulfate, and iron (III) sulfate;
the organic acid is malonic acid;
the peroxide is hydrogen peroxide; and
the positively charged amino acid is selected from the group consisting of lysine, histidine, and arginine.

12. The polishing composition of claim 11, further comprising a pH-adjusting agent present in a concentration from about 0.01 wt % to about 0.10 wt %.

13. The polishing composition of claim 12, wherein the pH-adjusting agent is nitric acid.

14. The polishing composition of claim 1, wherein,
the abrasive is cation-modified silica present in a concentration of about 0.01 wt % to about 5 wt %;
the oxidizer is a peroxide present in a concentration of about 0.1 wt % to about 2.5 wt %; and
the corrosion inhibitor is a positively charged amino acid present in a concentration of about 0.01 wt % to about 0.5 wt %.

15. A polishing composition comprising an abrasive, a molybdenum removal rate enhancer, an organic acid, an oxidizer, a corrosion inhibitor, and water, wherein
the abrasive is cation-modified silica present in a concentration of about 0.1 wt % to about 1.5 wt %;
the molybdenum removal rate enhancer is an iron salt present in a concentration of from about 0.0001 wt % to about 0.0007 wt %;
the oxidizer is a peroxide present in a concentration of about 0.1 wt % to about 2.5 wt %; and
the corrosion inhibitor is a positively charged amino acid present in a concentration of about 0.01 wt % to about 0.15 wt %;
wherein the polishing composition has a pH from about 2 to about 4.

16. A method for polishing a substrate, the method comprising the steps of:
a) providing the polishing composition of claim 1;
b) providing a substrate, wherein the substrate comprises a molybdenum containing layer; and
c) polishing the substrate with the polishing composition to provide a polished substrate.

17. The method of claim 16, wherein the substrate is a semiconductor.

18. The method of claim 17, wherein the substrate further comprises a silicon oxide layer.

\* \* \* \* \*